United States Patent [19]
Lin et al.

[11] Patent Number: 6,022,644
[45] Date of Patent: Feb. 8, 2000

[54] MASK CONTAINING SUBRESOLUTION LINE TO MINIMIZE PROXIMITY EFFECT OF CONTACT HOLE

[75] Inventors: Chia-Hui Lin, Hsinchu; San-De Tzu, Taipei, both of Taiwan

[73] Assignee: Taiwan Semiconductor Manufacturing Co., Ltd., Taiwan

[21] Appl. No.: 09/040,335

[22] Filed: Mar. 18, 1998

[51] Int. Cl.$^7$ ..................................................... G03F 9/00
[52] U.S. Cl. .................................................. 430/5; 430/30
[58] Field of Search ........................................... 430/5, 30

[56] References Cited

U.S. PATENT DOCUMENTS 5,879,844   3/1999   Yamamoto et al. ....................... 430/30

*Primary Examiner*—Christopher G. Young
*Attorney, Agent, or Firm*—Pillsbury Madison & Sutro LLP

[57] ABSTRACT

A electrical connection structure pattern according to the present invention includes a relatively dense first electrical connection structure area to a second electrical connection structure area. First, the electrical connection structure pattern is expensed to generate a first dummy pattern. The area of the first dummy pattern is larger than that of electrical connection structure pattern. Next, a second dummy pattern is generated by narrowing the line width of the first dummy pattern. A third dummy pattern is obtained by using CAD. The area of the third dummy pattern is smaller than that of the second dummy pattern, but larger than that of the electrical connection structure pattern. A fourth dummy pattern is generated by using CAD to remove the overlap area between the second dummy pattern and the third dummy pattern.

9 Claims, 5 Drawing Sheets

$F_3 = (F_1 - w) + W$ $F_4 = F_1 - ((F_1 - w) + W)$ $F_5 = P + (F_1 - ((F_1 - w) + W))$

MASK CONTAINING SUBRESOLUTION LINE TO MINIMIZE PROXIMITY EFFECT OF CONTACT HOLE

FIELD OF THE INVENTION

The present invention relates to a method of forming contact hole array for integrated circuits and especially to method of generating sub-resolution line by logic operation to minimize proximity effect of contact hole.

BACKGROUND OF THE INVENTION

There has been a great progress in the fabrication of integrated circuits in these years. High integration density makes the use of multilevel interconnections become a must. Thus, two or more layers of interconnections between circuit elements are now used. To provide vertical electrical connections between two conducting layers, contacts (or vias; by the term "contact" it is meant to cover both contact and via) are necessary. In order to achieve a better electrical connection between conducting structures or elements, the process of contact hole is quite often used to obtain aforementioned purpose. If the contact hole can not provides an effective conductive path, then some of the functions of devices will fail to perform their function. Therefore, contact hole process is one of the key ways to make sure that a layer will electrical connect to others.

Typically, the array of contact holes is regular and most of the shapes of the contact holes are squares or rectangulars. In fact, it's hard to control the CD (critical dimension) uniformity of a contact array or CD difference between dense and isolate holes. The attenuated phase shift mask becomes a mainstream as the design rule below 0.25 micron meter on deep ultra violate light (DUV) lithography process. However, at present, the exposed critical dimensions (CD) of the contact holes are not uniform in a contact hole array due to the optical proximity effect. Namely, the CD of an edge area in the array is quite different from one in center area. In addition, in areas having lager contact hole density, the exposed dimensions of contact holes are different from ones in areas having smaller contact hole density, although the original dimensions on a photomask in these two areas are the same. This effect will be more significant while the attenuated phase shifting mask (APSM) is employed, and even more when DUV lithography process is used. It sacrifices lots of process window that includes the exposure latitude (EL) and the depth of focus (DOF). Although the APSM can improve the DOF of contact hole, however, the CD difference due to the proximity effect contribution worsens than conventional mask.

A conventional way to add sub-resolution dummy holes has been proposed to minimize the CD difference between edge and center areas in a contact hole array. As shown in FIG. 1, sub-resolution lines are added around the contact holes to minimize the optical proximity effect. The method can be performed by software of optical proximity correction (OPC). Unfortunately, it has lots of limitation by using the automatic correction of software application. For example, the conversion time of the method is long, and the method is not suitable for a contact hole with a polygon shape or the like. Further, the sub-resolution method can only be applied to where the shape of the contact hole is rectangular and the configuration of contact hole array is regular. It can not be used while the shape of the contact hole is not 90-degree angled, nor while the arrangement of contact hole is irregular. There is a risk on data conversion between hierarchy and flatten structure.

SUMMARY OF THE INVENTION

A contact hole pattern according to the present invention includes a relatively dense contact hole area to a contact hole area. First, the contact hole pattern is expanded by a dimension to generate a first dummy pattern. The area of the first dummy pattern is larger than that of contact hole pattern. Next, a second dummy pattern is generated by narrowing the line width of the first dummy pattern. The area of the second dummy pattern is smaller than that of the first dummy pattern, but larger than that of the contact hole pattern. A third dummy pattern is obtained. The area of the third dummy pattern is smaller than that of the second dummy pattern, but larger than that of the contact hole pattern. A fourth dummy pattern is generated. In the step, the overlap area between the second dummy pattern and the third dummy pattern is removed.

Another embodiment of the present invention is applied to a contact hole pattern having an isolated contact hole and a group of contact hole. A first dummy pattern is generated. The first dummy pattern surrounds each contact hole in the contact hole pattern with a distance d. The first dummy pattern includes an overlap portion. Next, a second dummy pattern is generated by narrowing the first dummy pattern with a valve. Next step is to expand the line width of the second dummy pattern. Therefore, a third dummy pattern is obtained. A fourth dummy pattern is generated to remove the overlap portion of the first dummy pattern.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
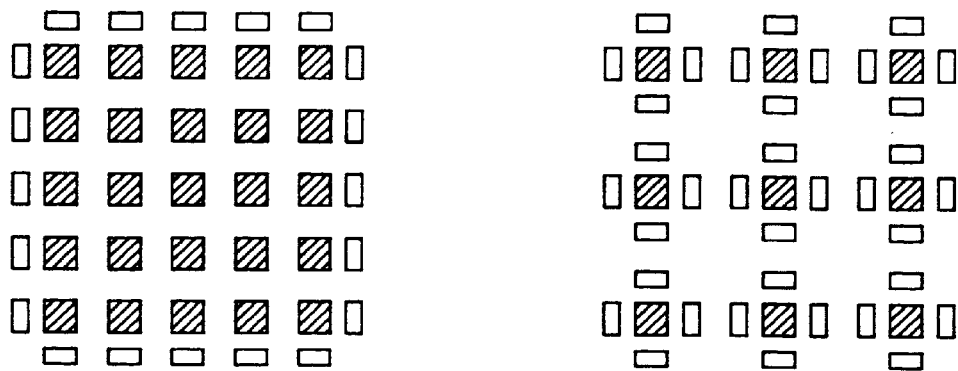
FIG. 1 is an illustration of contact holes with sub-resolution lines according to the prior art.
Figure 2:
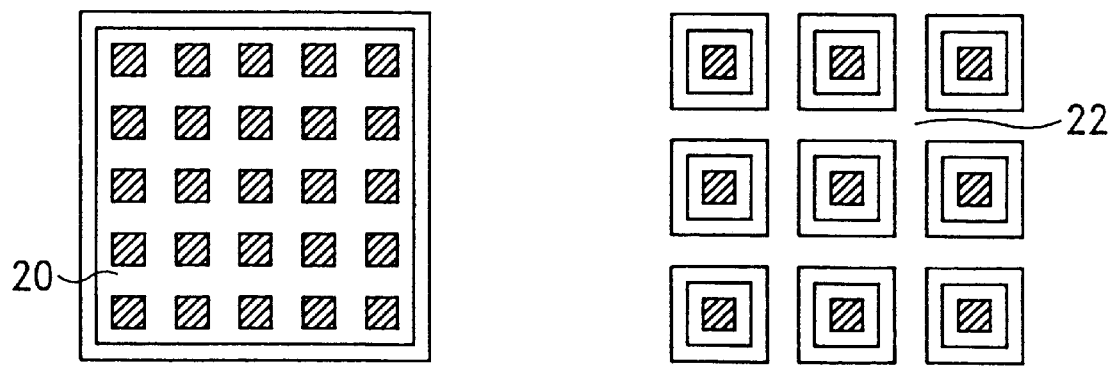
FIG. 2 is an illustration of contact holes with dummy pattern according to the present invention.

The present invention discloses a novel method used in semiconductor process. The present invention is most useful for those processes used to form the contact holes. A contact hole exhibits a function for electrical connection between conductive structures. A via hole has the similar function with the contact hole. Thus, the present invention can also be used to form contact hole or via hole for electrical connection. Both of the contact hole, via hole are used for electrical connection in the integrated circuits, which are indicated as an electrical connection structure. In order to have a good description about the present invention, the contact hole is used as an example according to the present invention. The present invention minimizes the CD variation problem in a contact hole array by logic operation method. In order the eliminates the optical proximately effect, a conventional method called software automatic conversion is used. However, the time for conversion data of the conventional method is too long. Conversely, the present invention exhibits the characteristic that the conversion of data is easier than software automatic conversion. It also minimizes the optical proximity effect. Further, the present invention can solve the problem associated with the CD non-uniform in a contact hole array. The logic operation, as shown in FIG. 2, is useful for any shape of electrical connection structure pattern, such as contact hole pattern. The logical operation can be applied to contact hole pattern with a relative dense contact hole area 20 to a contact hole area 22. The more detail description of the present invention will be seen as follows.

In order to have a detail description, a plurality of parameters are defined as follows:

P : an initial pattern for used in integrated circuits

B or W: a variable parameter of an expanded dimension of a pattern.

C or W: a variable parameter of a narrowed dimension of a pattern.

An electrical connection structure, for example, a contact hole pattern is configured in any shape, such as a square, a rectangular, polygon or the like. For example, referring to FIG. 3, the contact hole pattern P according to the present invention is provided for integrated circuits. The line width of the contact hole pattern P is indicated by L. The integrated circuits are typically formed in the area of a wafer. Of course, the present invention can be applied in the contact hole pattern with uniform density of contact hole. In order to show the benefits of the present invention, the contact hole pattern having non-uniform density is used as an example. The contact hole pattern P may include at least a first contact hole area 32 and a second contact hole area 34. The first contact hole area 32 having a relatively dense contact hole to the one of said second contact hole area 34. The first contact hole area 32 is separated from the second contact hole area 34 with a least space S.

Figure 4:
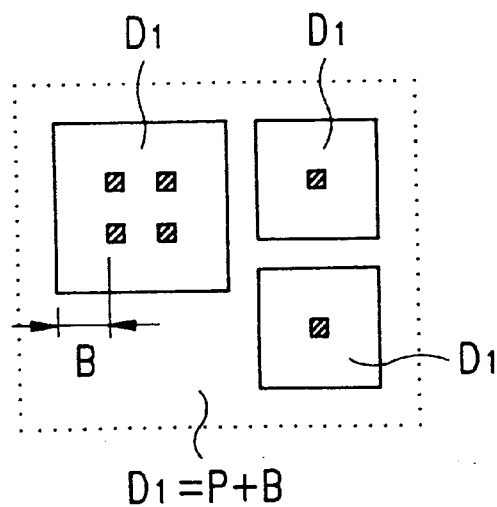
FIG. 4 is an illustration showing the step of generating a first dummy pattern of the first embodiment in accordance with the present invention.

As shown in FIG. 4, the contact hole pattern 30 is expanded by a first dimension B to generate a first dummy pattern D1. The B is larger or equal to the least line width. Further, the first dimension B is less than S/2. In the step, the area of the first dummy pattern D1 is larger than that of contact hole pattern P, as shown in FIG. 4. The contact holes are located in the second dummy pattern D2.

Figure 5:
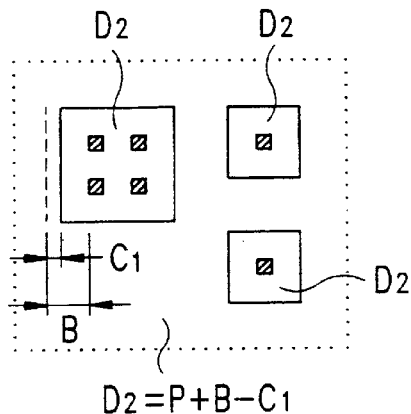
FIG. 5 is an illustration showing the step of generating a second dummy pattern of the first embodiment in accordance with the present invention.

Next turning to FIG. 5, a second dummy pattern D2 is generated by narrowing the dimension of the first dummy pattern D1. For example, the first dummy pattern D1 is narrowed by a second dimension C1. The area of the second dummy pattern D2 is smaller than that of the first dummy pattern D1, but larger than that of the contact hole pattern P. In order to achieve this, the first dimension B is larger than the second dimension C1. The contact holes are located in the second dummy pattern D2. Further, the second dimension C1 is larger or equal to the least line width .

Figure 6:
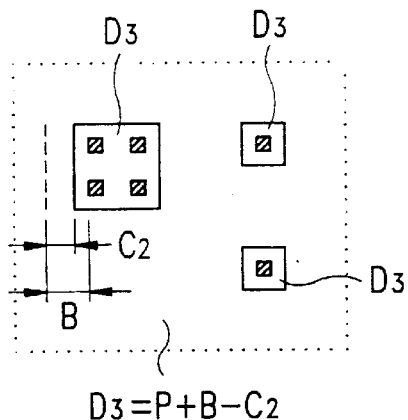
FIG. 6 is an illustration showing the step of generating a third dummy pattern of the first embodiment in accordance with the present invention.

As shown in FIG. 6, a third dummy pattern D3 is obtained by narrowing a C2, the C2 represents a third dimension. The first dimension is larger than the third width. Similarly, The area of the third dummy pattern D3 is smaller than that of the second dummy pattern D2, but larger than that of the contact hole pattern P. The second dimension C1 is also larger or equal to the least line width. Under this condition, the third dimension C2 is larger than the second dimension C1. The contact holes are still located in the third dummy pattern D3.

Figure 7:
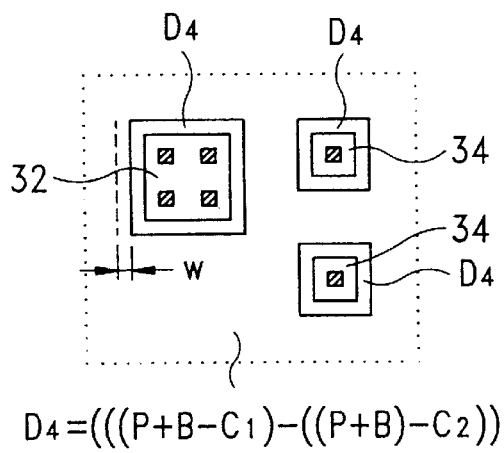
FIG. 7 is an illustration showing the step of generating a fourth dummy pattern of the first embodiment in accordance with the present invention.

Then referring to FIG. 7, a fourth dummy pattern D4 is generated by performing following step. The third dummy pattern D3 is overlapped on the second dummy pattern D2, then an overlap portion between the second dummy pattern D2 and the third dummy pattern D3 is removed. Thus, a final contact hole pattern P with dummy pattern D4 is generated. The CD non-uniform problem in a contact hole array will be solved due to the forth dummy pattern D4 surrounds the contact hole pattern P. Further, the present invention minimizes the optical proximity effect and to minimizes a critical dimension (CD) variation problem. It can be seen in the FIG. 7, no matter in the contact hole area 34 or in the relatively dense contact hole area 32 to a contact hole area 34, all of the contact hole areas 32, 34 are surrounded by the fourth dummy pattern D4. The width of the fourth dummy pattern D4 is defined by (C2−C1=w). The fourth dummy pattern D4 includes at least one ring shape pattern having a fourth dimension w to surround each contact hole.

Figure 8:
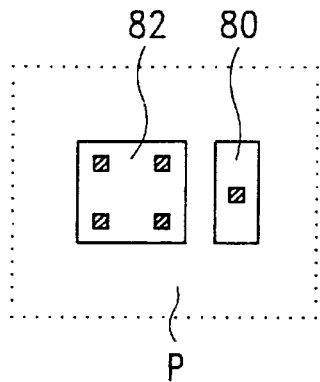
FIG. 8 is an illustration of a contact hole pattern of a second embodiment in accordance with the present invention.
Figure 9:
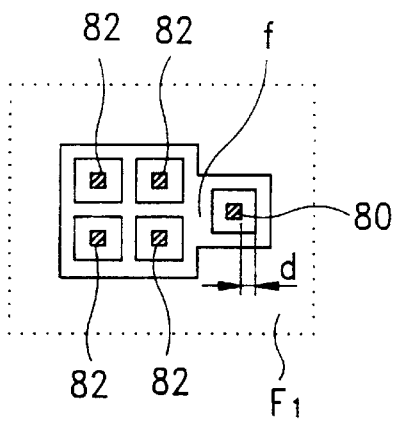
FIG. 9 is an illustration showing the fourth dummy pattern having an overlap portion of the second embodiment in accordance with the present invention.

However, in some cases, the fourth dummy pattern that is indicated by F1 (in order to distinguish from the first embodiment) may include an overlap portion f, as shown in FIG. 9. Assume that the initial contact hole pattern P is configured as shown in FIG. 8. The contact hole pattern P has a first contact hole area 82, which has relatively high density of contact hole compared to a second contact hole area 80. The fourth dummy pattern F1 surrounds each contact hole in the contact hole pattern with a distance d. The first dummy pattern F1 includes an overlap portion f.

Figure 10:
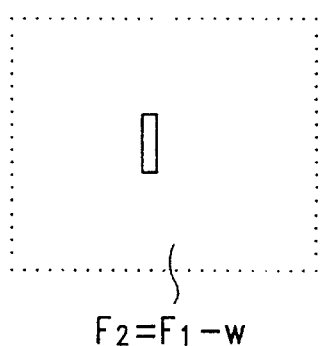
FIG. 10 is an illustration showing the step of generating a fifth dummy pattern of the second embodiment in accordance with the present invention.
Figure 11:
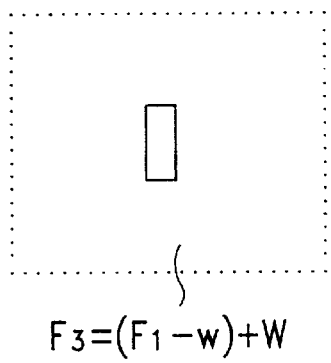
FIG. 11 is an illustration showing the step of generating a sixth dummy pattern of the second embodiment in accordance with the present invention.

Next, see FIG. 10, a fifth dummy pattern F2 is generated by performing following step. In the step, the fifth dummy pattern F2 is formed by narrowing the first dummy pattern F1 with a fifth dimension such that the fifth dummy pattern F2 at least includes the overlap portion f. The fifth dimension w is related to the dimension of the contact hole pattern P and the dimension of the overlap portion f. Next step is to expand the dimension of the fifth dummy pattern F2 with a sixth dimension width W to make sure that the fifth dummy pattern F2 includes the overlap portion f. Thus, a sixth dummy pattern F3 is obtained, as shown in FIG. 11.

Figure 12:
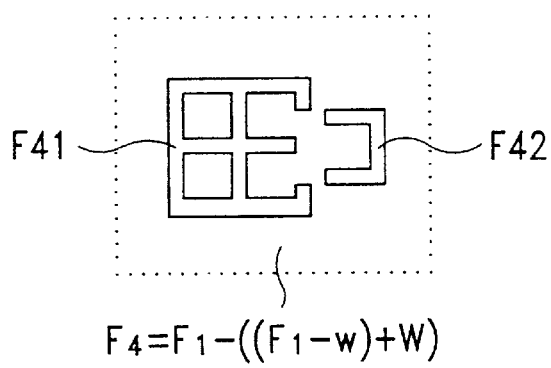
FIG. 12 is an illustration showing the step of generating a seventh dummy pattern of the second embodiment in accordance with the present invention.

Turning to FIG. 12, a seventh dummy pattern F4 is generated to overlap the sixth dummy pattern F3 with the fourth dummy pattern F1, and to remove at least the overlap portion f of the first dummy pattern F1. Namely, the seventh dummy pattern is generated by removing the overlap portion between the fourth dummy pattern F1 and the sixth dummy pattern F3. Finally, turning to FIG. 13, the seventh dummy pattern F4 is overlapped with the contact hole pattern P, therefore generating a pattern F5 consisted of a contact hole pattern P with the seventh dummy pattern F4.

Figure 3:
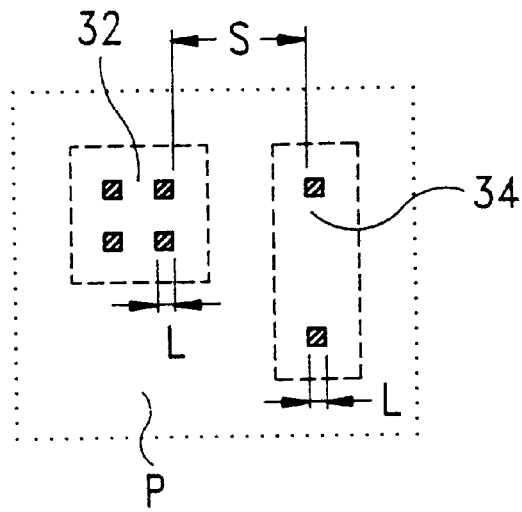
FIG. 3 is an illustration of a contact hole pattern of a first embodiment in accordance with the present invention.
Figure 13:
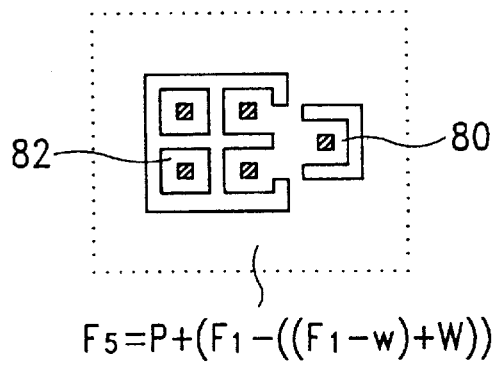
FIG. 13 is an illustration showing the step of generating a contact hole with the seventh dummy pattern of the second embodiment in accordance with the present invention.

As seen from FIGS. 7, 12, and 13, a photomask according to this invention for forming an electrical conducting pattern, for example contact hole or via hole pattern on a semiconductor circuit wafer, includes an electrical conducting pattern having normal resolution, which is indicated by P in FIG. 3, or 8, and a dummy pattern D4 or F4 having subresolution (FIG. 7. or FIG. 12). The electric conducting pattern is surrounded by dummy pattern in a close way or partially close way (Please see FIGS. 7 and 13). As shown in FIG. 7, the electrical conducting pattern includes at least one first conducting pattern 32 and at least one second conducting pattern 34, wherein the first conducting pattern 32 has relatively high pattern density to the second conducting pattern 34. The embodiment according tot FIG. 7, the at least one dummy pattern D4 surrounds the at least one first conducting pattern 32 as a whole, but surrounds the at least one second conducting pattern separately. In FIG. 13, the first conducting pattern is denoted by 82, while the second conducting pattern is denoted by 80. The dummy pattern comprises close shapes such as rectangular ring shape (D4). Or, the dummy pattern may comprise open shapes consisting of a substantial portion of a close shape, such as a substantial portion of a rectangular shape (F42). Or the dummy pattern may comprise combination of the aforementioned shapes (F41, F4).

To phrase in another way, the photomask according to FIG. 7 includes an electrical conducting pattern having normal resolution, wherein the electrical conducting pattern includes a first pattern area having relatively high pattern density to a second pattern area. A first and at least one second dummy patterns have subresolution. The first pattern area is surrounding by the first dummy pattern in a closed way. Each individual pattern of the second pattern area is respectively surrounded by the at least one second dummy pattern in a closed way. The first and second dummy patterns comprise a closed shape. The mask according to FIG. 13 comprises an electrical conducting pattern having normal resolution, wherein the electrical conducting pattern includes a dense pattern area having relatively high pattern density to an isolated pattern. The first and a second dummy patterns have subresolution. The first dummy pattern surrounds each side of the individual pattern of the dense pattern area in a closed shape except for the sub-pattern facing to the isolated pattern, the second dummy pattern surrounds three sides of the isolated pattern except for the side facing to the dense pattern area. The closed shape comprises a rectangular shape. Further, the second dummy pattern comprises an opened shape consisting of a substantial portion of a closed shape. The opened shape includes a substantial portions of a rectangular shape. Furthermore, the first dummy pattern comprises the combinations of a first closed shape and an open shape consisting of a substantial portion of a second closed shape. Both the first and second closed shapes comprise a rectangular shape.

As well known in the art, via holes and the contact holes are alike in many aspects. Thus, the present invention can also be used to form via holes for electrical connection. By the term "electrical connection structure", holes are intended to be covered. As is understood by a person skilled in the art, the foregoing preferred embodiments of the present invention are illustrative rather than limiting. For example, the contact or via holes may be of a shape other than rectangular; so are the dummy patterns. It is intended to cover various modifications and similar arrangements included within the spirit and scope of the appended claims, and the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

I claim:

1. A photomask for forming an electrical conducting pattern on a semiconductor circuit, said photomask comprising:

an electrical conducting pattern having normal resolution, wherein said electrical conducting pattern includes a first pattern area having relatively high pattern density to a second pattern area; and a first and at least one second dummy patterns having subresolution, said first pattern area being surrounded by said first dummy pattern in a closed way, wherein each individual pattern of said second pattern area is respectively surrounded by said at least one second dummy pattern in a closed way.

2. The photomask of claim 1, wherein said first and second dummy patterns comprises a closed shape.

3. A photomask for forming an electrical conducting pattern on a semiconductor circuit, said photomask comprising:

an electrical conducting pattern having normal resolution, wherein said electrical conducting pattern includes a dense pattern area having relatively high pattern density to an isolated pattern; and a first and a second dummy patterns having subresolution, a first dummy pattern surrounding each side of individual pattern of said dense pattern area in a closed shape except for said sub-pattern facing to said isolated pattern, said second dummy pattern surrounding three sides of said isolated pattern except for the side facing to said dense pattern area.

4. The photomask of claim 3, wherein said closed shape comprises a rectangular shape.

5. The photomask of claim 4, wherein said second dummy pattern comprises an opened shape consisting of a substantial portion of a closed shape.

6. The photomask of claim 5, wherein said open shape comprises a substantial portions of a rectangular shape.

7. The photomask of claim 3, wherein said first dummy pattern comprises combinations of a first closed shape and an open shape consisting of a substantial portion of a second closed shape.

8. The photomask of claim 7, wherein said first closed shape comprises a rectangular shape.

9. The photomask of claim 7, wherein said open shape comprises a substantial portions of a rectangular shape.

* * * * *